(12) United States Patent
Lu

(10) Patent No.: US 6,303,497 B1
(45) Date of Patent: Oct. 16, 2001

(54) METHOD OF FABRICATING A CONTACT WINDOW

(75) Inventor: Jau-Hone Lu, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/306,244

(22) Filed: May 6, 1999

(30) Foreign Application Priority Data

Apr. 16, 1999 (TW) .............................. 88106101 A

(51) Int. Cl.[7] .................................. H01L 21/44
(52) U.S. Cl. ............................ 438/672; 438/598
(58) Field of Search ........................ 438/584, 597, 438/598, 672, 675, 677

(56) References Cited

U.S. PATENT DOCUMENTS 5,094,980 * 3/1992 Shepela .

5,973,371 * 10/1999 Kasai ................................. 257/382
6,146,978 * 11/2000 Michael et al. .

OTHER PUBLICATIONS

Wolf, Silicon Processing for the VLSI Era vol. 2: Process Integration, 1990, Lattice Press, p. 199.*

* cited by examiner

*Primary Examiner*—Tuan H. Nguyen
*Assistant Examiner*—Evan Pert
(74) *Attorney, Agent, or Firm*—Jiawei Huang; J. C. Patents

(57) ABSTRACT

A method of fabricating a contact window of a semiconductor device is described in which a conductive layer is used to cover the boundary of the neighboring isolation structure of the source/drain region, or to also cover the source/drain region. An insulation layer is formed on the entire substrate. The insulation layer is then defined to form a contact window, exposing the source/drain region or exposing the conductive layer located on top of the source/drain region.

6 Claims, 5 Drawing Sheets ns of the present invention.

METHOD OF FABRICATING A CONTACT WINDOW

BACKGROUND OF THE INVENTION

1. Field of the Invention

The invention relates to the fabrication process of a semiconductor device, and more particularly, relates to the fabrication process of a contact window.

2. Description of the Related Art

As the density or integrated circuits is further increased by continuously shrinking the device dimensions, the line width, the contact area and the junction depth are continuously being miniaturized. When forming a contact window of a source/drain region, due to a reduction of the contact area, the demand for an accurate alignment is increased. The probability of a misalignment is also increased. In the process of etching the contact window, it is common that the boundary of the neighboring isolation structure of the source/drain region, such as a field oxide layer (FOX) or a shallow isolation trench (STI), is coincidentally removed, resulting in a leakage current.

SUMMARY OF THE INVENTION

Accordingly, the invention provides a fabrication method of a contact window of a semiconductor device. This invention utilizes a conductive layer to cover the boundary of the neighboring isolation structure of the source/drain region, or to also cover the source/drain region. Further, an insulation layer is formed on the entire substrate. The insulation layer is then defined to form a contact window, exposing the source/drain region, or exposing the conductive layer located on top of the source/drain region.

A preferred embodiment of this invention in providing a fabricating method of a contact window comprises the following steps. A mask layer is formed on the substrate and then defined. An opening is formed, exposing the source/drain region and a portion of the neighboring isolation structure located on the outside boundary of the source/drain region. A conductive layer is then formed on the mask layer and on the opening. The conductive layer is etched back to form a spacer on the side wall of the opening to cover the device isolation structure. An insulation layer is further formed on the substrate, followed by forming a contact window in the insulation layer to expose the source/drain region.

Another preferred embodiment of this invention in providing a fabricating method of a contact window comprises the following steps. A mask layer is formed on the substrate and then defined. An opening is formed, exposing the source/drain region and the neighboring isolation structure located on the outside boundary of the source/drain region. A conductive layer is formed on th mask layer and on the opening. A planarization process is conducted, using the mask layer as a stop layer, to remove the conductive layer, forming a conductive pad in the opening. After forming an insulation layer on the substrate, an opening for the contact window is formed in the insulation layer to expose a portion of the conductive layer in the opening.

Another preferred embodiment of this invention in providing a fabricating method of a contact window comprises the following steps. A conductive layer is formed on the substrate and then defined to form a conductive pad, covering the source/drain region and a portion of the neighboring isolation structure located on the outside boundary of the source/drain region. An insulation layer is deposited on the substrate, followed by forming a contact window in the insulation layer to expose a portion of the conductive pad.

In accordance to this invention and the embodiments of this invention, during the process of forming the contact window, utilizing a conductive layer to protect the boundary of the device isolation structure prevents damage to the boundary of the device isolation structure, even though misalignment may occur. With the boundary of the device isolation structure being protected from damage, a current leakage at the source/drain region is prevented, thereby allowing the design for the dimensions of the contact window to be more flexible. The invention at the least, comprises the advantages of preventing a current leakage at the source/drain region and of increasing the contact area.

BRIEF DESCRIPTION OF THE DRAWINGS

The accompanying drawings illustrate presently preferred embodiments of the invention and together with the general description given above and the detailed description of the preferred embodiment given below, serve to explain the principles of the invention.

DESCRIPTION OF THE PREFERRED EMBODIMENTS

First Embodiment

FIGS. 1A to 1D are the cross sectional views showing the steps of a method in fabricating a contact window of a semiconductor device according to the first preferred embodiment of the present invention.

Figure 1A:
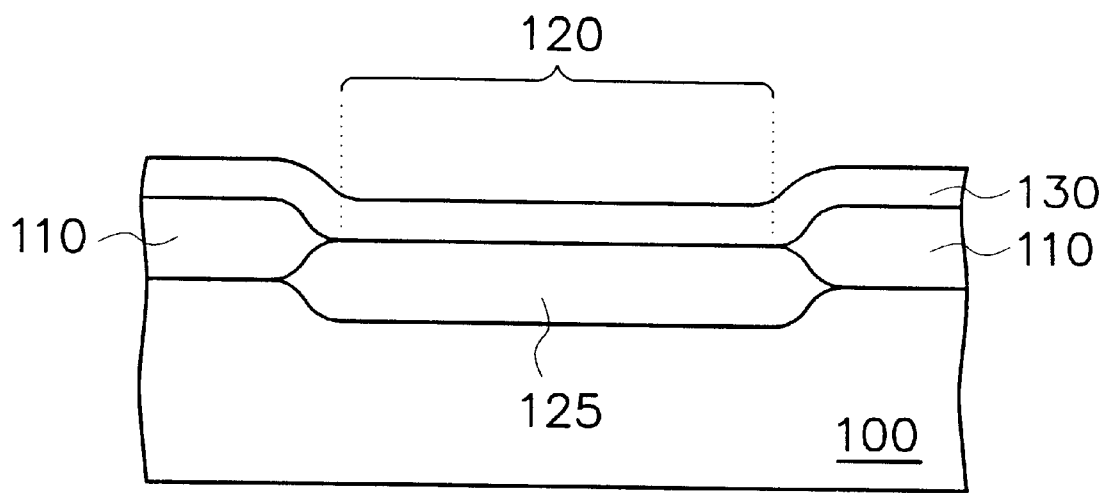
FIG. 1A to FIG. 1D are cross sectional views of a semiconductor device showing the progression of manufacturing steps in the production of a contact window according to the first preferred embodiment of the present invention.

Referring to FIG. 1A, a substrate 100 comprises a device isolation structure 110, and active region 120 surrounded by the isolation structure 110, and a source/drain 125 region located in the active region 120. The device isolation structure 110 includes a shallow isolation trench or a field oxide layer. A mask layer 130 with an approximated thickness of about 2000 Å is formed on the substrate 100. The mask layer 130, for example, a silicon nitride, is deposited by methods including the chemical vapor deposition method.

Figure 1B:
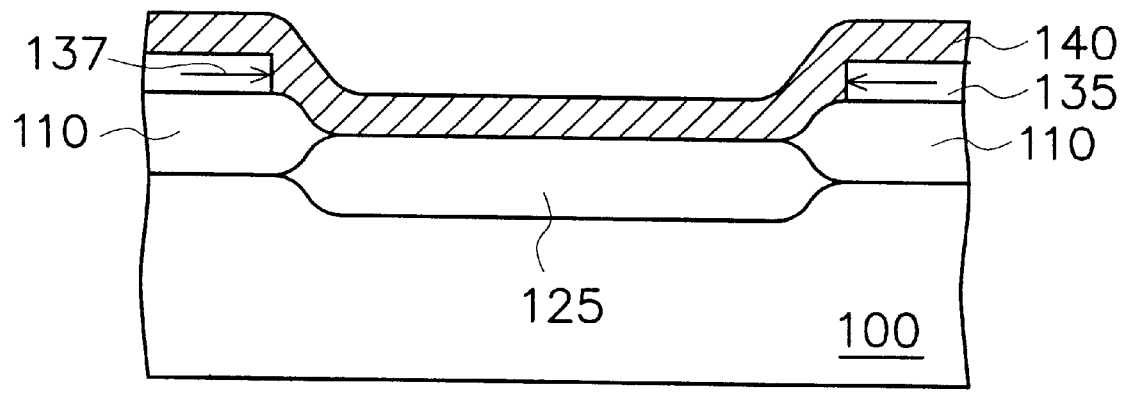

According to FIG. 1B, the mask layer 130 is defined, forming an opening 137 to expose the source/drain region 125 and a portion of the neighboring isolation structure 110 around the source/drain region 125. After the mask layer 130 is defined, the remaining mask layer is referred as the mask layer 135. A conductive layer 140 is then formed on the mask layer 135 and on the opening 137. The conductive layer 140, for example, a doped polysilicon or a tungsten silicide, is deposited by methods including the chemical vapor deposition method.

Figure 1C:
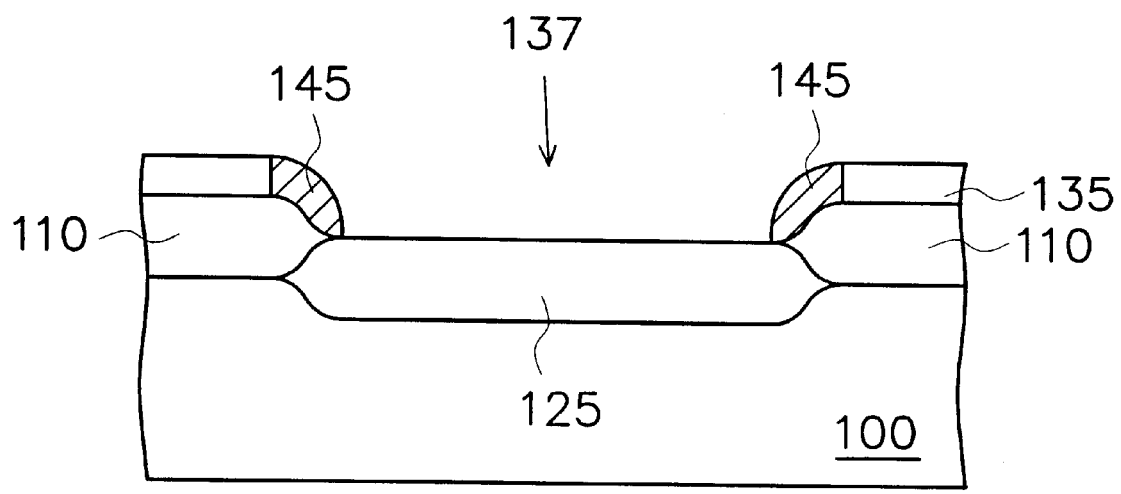

As shown in FIG. 1C, the conductive layer 140 is etched back to form a conductive spacer 145 on a sidewall of the opening 137 to cover the edge of the device isolation structure 110. That is, a boundary between the source/drain region 125 and the device isolation structure 110 is covered by the spacer 145. The method that is used for the etching back process includes the dry etching method.

Figure 1D:
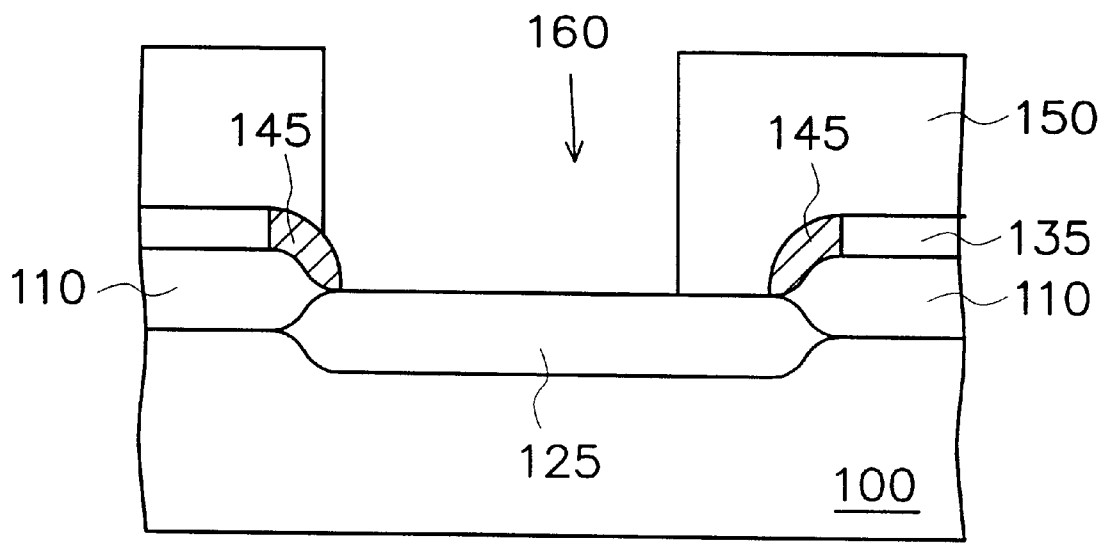

According to FIG. 1D, after forming an insulation layer 150 on the substrate 100, a contact window 160 is formed in the insulation layer 150 to expose the surface of the source/drain region 125. The insulation layer 150, for example, a silicon oxide layer is deposited by methods including the chemical vapor deposition method.

Since the boundary of the isolation structure 110 is being protected by the conductive spacer 145, in the process of etching the contact window 160, even though misalignment may occur, the device isolation structure is protected from damage and any resulting leakage current. Using tungsten silicide for the spacer further decreases the contact resistance.

Second Embodiment

FIGS. 2A to 2D are the cross sectional views showing the steps of a method in fabrication a contact window of a semiconductor device according to the second embodiment of the present invention.

Figure 2A:
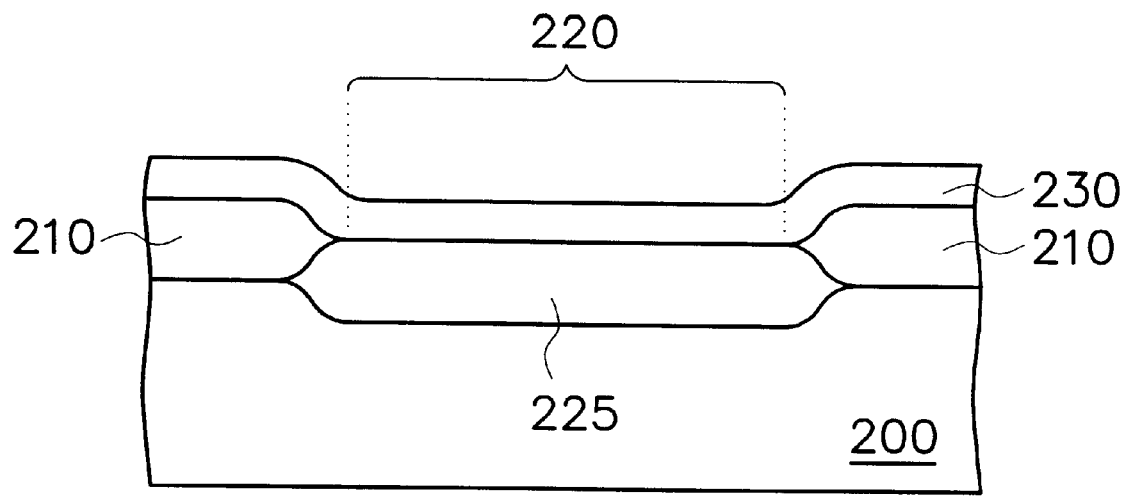
FIG. 2A to FIG. 2D are cross sectional views of a semiconductor device showing the progression of manufacturing steps in the production of a contact window according to the second preferred embodiment of the present invention.
Figure 2B:
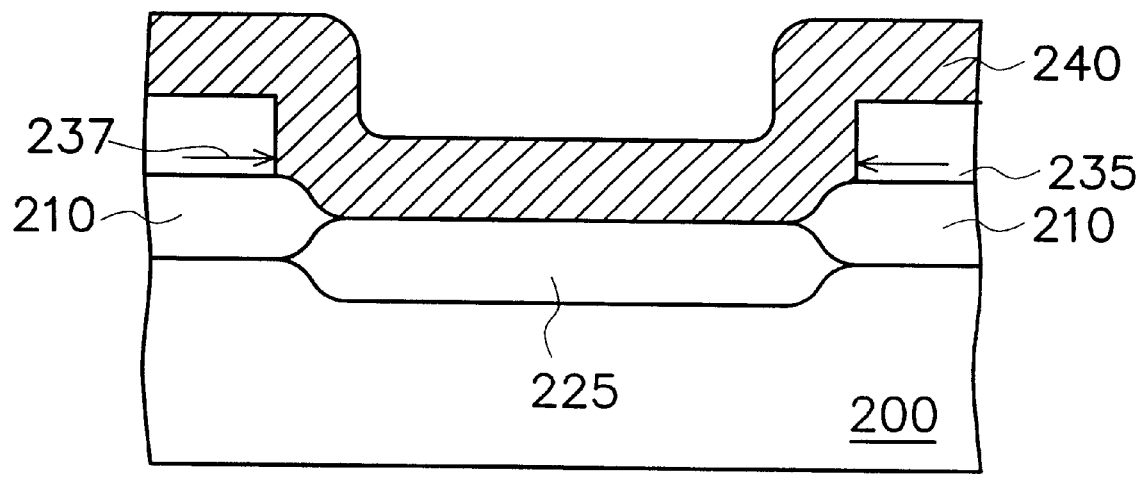

Referring to FIG. 2A, a substrate 200 comprises a device isolation structure 210, and active region 220 surrounded by the isolation structure 210, a source/drain 225 region located in the active region 220. The device isolation structure 210 includes a shallow isolation trench or a field oxide layer. A mask layer 230 with an approximated thickness of 5000 to 6000 Å is formed on the substrate 200. A mask layer, for example, a silicon nitride, is deposited by methods including the chemical vapor deposition method According to FIG. 2B, the mask layer 230 is defined, forming an opening 237 to expose the source/drain region 225 and a portion of the neighboring isolation structure 210 located on the outside boundary of the source/drain region. After the mask layer 230 is defined, the remaining mask layer is referred as the mask layer 235. A conductive layer 240 is then deposited on the mask layer 235 and on the opening 237. The conductive layer 240, for example, a doped polysilicon or a tungsten silicide, is deposited by methods including the chemical vapor deposition method.

Figure 2C:
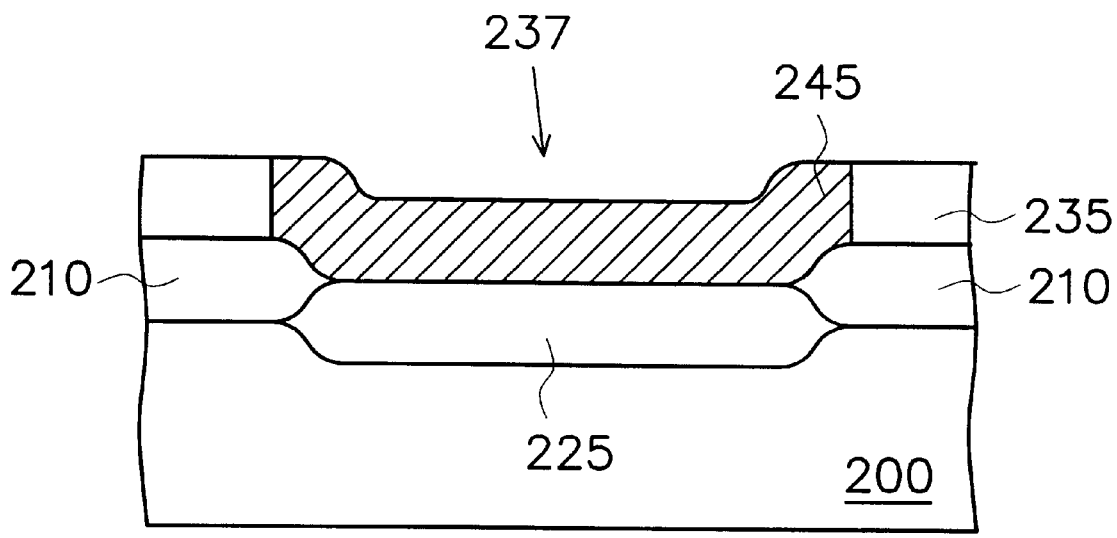

As shown in FIG. 2C, using the mask layer 235 as a stop layer, the conductive layer 240 is planarized by, for example, the chemical mechanical polishing process, leaving only the conductive pad 245 in the opening 237.

Figure 2D:
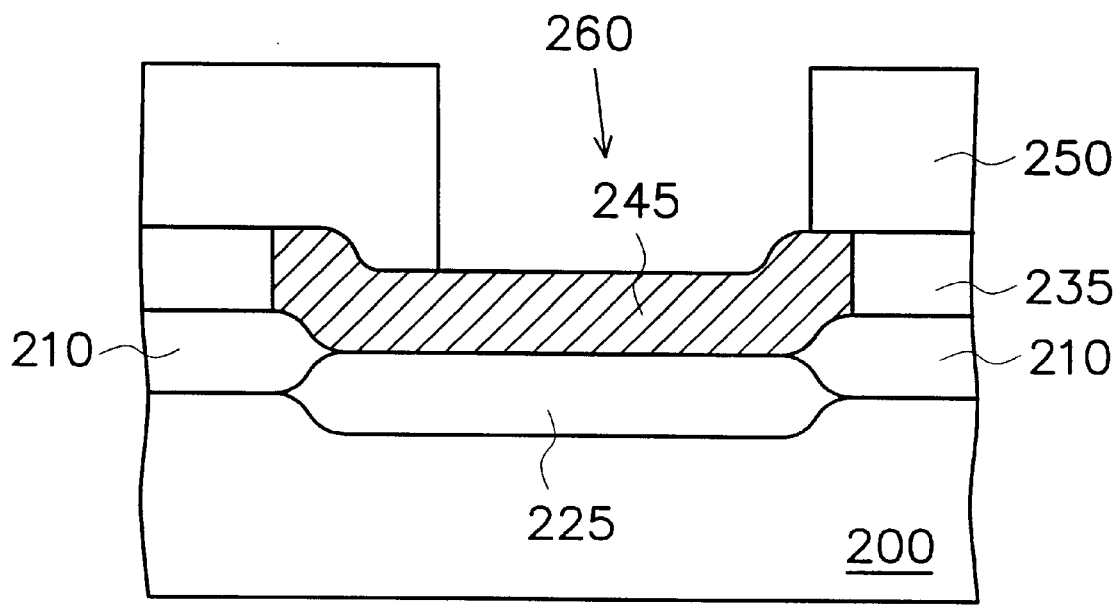

According to FIG. 2D, after forming an insulation layer 250 on the substrate 200, a contact window 260 is formed in the insulation layer 250 to expose a portion of the conductive pad 245. The insulation layer 150, for example, a silicon oxide layer, is deposited by methods including the chemical vapor deposition method.

According to this embodiment, both the source/drain region 225 and the boundary of the neighboring isolation structures 210 are covered by the conductive pad 245. In the process of etching the contact window 260, even though the issue of misalignment occurs, the boundary of the neighboring isolation structure of the source/drain device is protected from damage that could result in a current leakage. Using a tungsten silicide for the conductive pad can also effectively decrease the contact resistance.

Third Embodiment

Figure 3A:
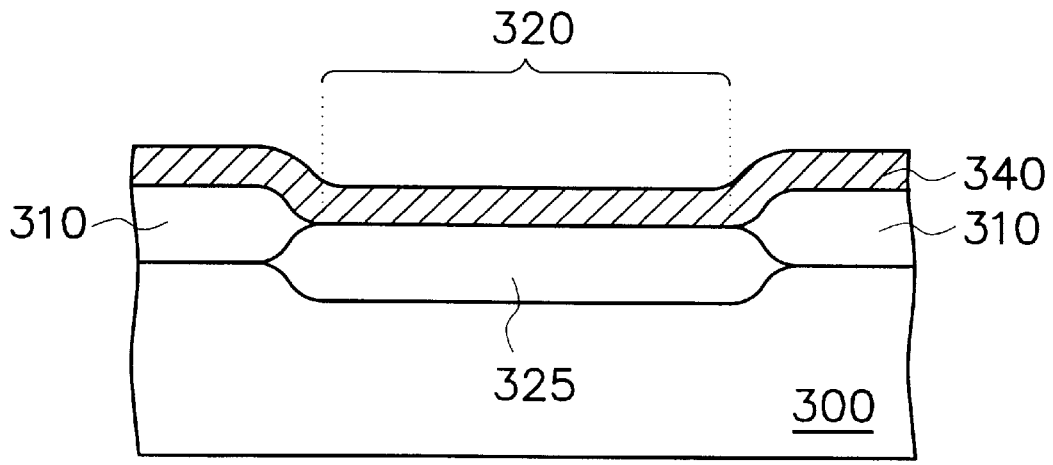
FIG. 3A to FIG. 3C are cross sectional views of a semiconductor device showing the progression of manufacturing steps in the production of a contact window according to the third preferred embodiment of the present invention.
Figure 3B:
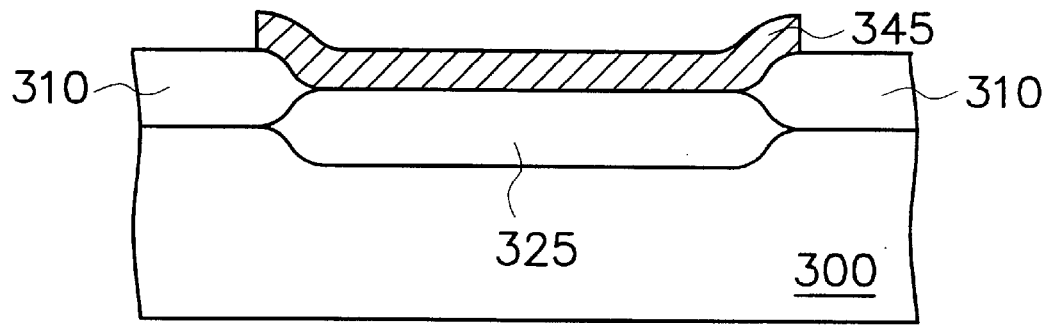
Figure 3C:
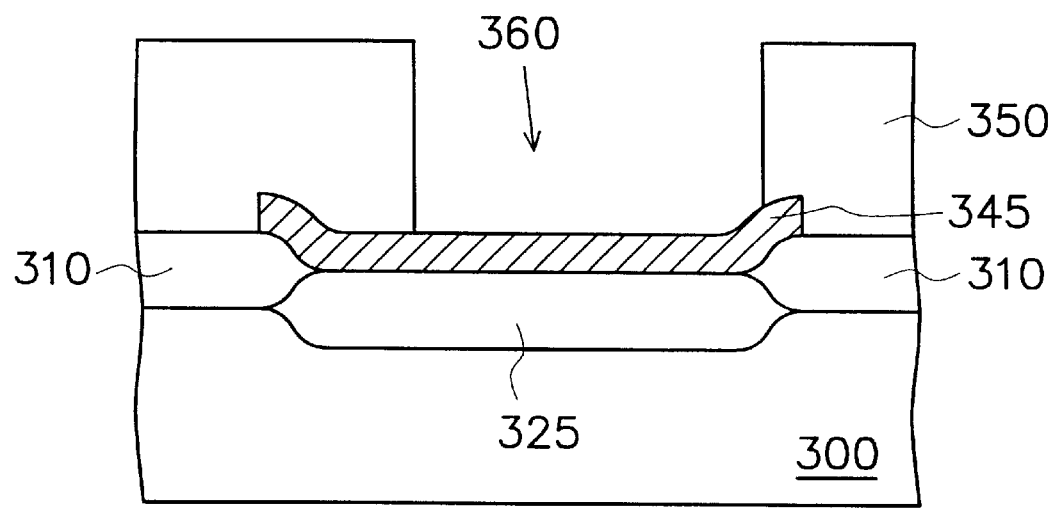

FIGS. 3A to 3C are the cross sectional views showing the steps of a method in fabrication a contact window of a semiconductor device according to the third embodiment of the present invention.

Referring to FIG. 3A, a substrate 300 comprises of a device isolation structure 310, an active region 320 surrounded by the isolation structure 310, a source/drain 325 region located in the active region 320. A conductive layer 340 is formed on the substrate 300. The conductive layer, for example, a doped polysilicon or a tungsten silicide, is deposited by methods including the chemical vapor deposition method.

According the FIG. 3B, the conductive layer 340 is defined, forming a conductive pad 345 to cover the source/drain region 325 and a portion of the neighboring isolation structure 310 on the outside boundary of the source/drain region 325.

As shown in FIG. 3C, an insulation layer 350 is formed on the substrate 300, and a contact window is formed in the insulation layer to expose a portion of the conductive pad 345. The insulation layer 345, for example, a silicon oxide, is deposited by methods including the chemical vapor deposition method.

The concepts behind embodiments 2 and 3 are similar. In both embodiment 2 and embodiment 3, a conductive pad 345 is formed to protect the source/drain region and a portion of the neighboring isolation structure 310 on the outside boundary of the source/drain region 325 from damage.

According to the preferred embodiments of the invention, the invention comprises the following advantages. During the process of forming a contact window using a conductive layer to protect the boundary of the device isolation structure prevents damages to the boundary of the device isolation structure and a current leakage at the source/drain region, even though the issue of misalignment occurs. As a result, the design for the dimensions of the contact window can be more flexible. The main reason that the conductive layer provides protection for the device isolation structure is because the conductive layer and the insulation layer are made from different materials with different etching rates. The insulation layer, with a faster etching rate than the conductive layer, is being selectively removed, leaving the conductive layer to protect the isolation structure. Therefore, not only a current leakage at the source/drain region is prevented, the contact resistance is reduced with an increased contact area.

Additional advantages and modifications will readily occurs to those skilled in the art from consideration of the specification and practice of the invention disclosed herein.

It is intended that the specification and examples to be considered as exemplary only, with a true scope and spirit of the invention being indicated by the following claims.

What is claimed is:

1. A method of fabricating a contact window of a semiconductor device, wherein a substrate comprising an active region surrounded by an isolation structure and a source/drain region located in the active region is provided, the method comprising the steps of:

forming a mask layer on the substrate;

defining the mask layer and forming an opening to expose the source/drain region and to expose a portion of a neighboring isolation structure around an edge of the source/drain region;

forming a conductive spacer on a sidewall of the opening to cover a boundary of the device isolation structure;

forming an insulation layer on the substrate; and forming a contact window in the insulation layer to expose the source/drain region.

2. The method of forming a contact window of a semiconductor device according to claim 1, wherein the mask layer includes a silicon nitride layer formed by a chemical deposition method.

3. The method of forming a contact window of a semiconductor device according to claim 1, wherein the mask layer is approximately 2000 Å in thickness.

4. The method of forming a contact window of a semiconductor device according to claim 1, wherein the material of the conductive spacer comprises doped polysilicon.

5. The method of forming a contact window of a semiconductor device according to claim 1, wherein the material of the conductive spacer comprises tungsten silicide.

6. The method of forming a contact window of a semiconductor device according to claim 1, wherein the conductive spacer is formed by dry etching back a layer of conductive material.

* * * * *